United States Patent [19]
Takada et al.

[11] Patent Number: 5,917,187
[45] Date of Patent: Jun. 29, 1999

[54] PYROELECTRIC INFRARED RAY SENSOR

[75] Inventors: Yuji Takada; Toshio Fujimura; Teruki Hatatani; Shinji Sakamoto, all of Kadoma, Japan

[73] Assignee: Matsushita Electric Works, Ltd., Osaka, Japan

[21] Appl. No.: 08/972,907

[22] Filed: Nov. 18, 1997

[30] Foreign Application Priority Data

Sep. 12, 1997 [JP] Japan .................................. 9-249181

[51] Int. Cl.[6] ....................................................... G01J 5/10
[52] U.S. Cl. ..................................... 250/338.3; 250/338.2
[58] Field of Search ............................... 250/338.3, 338.2

[56] References Cited

U.S. PATENT DOCUMENTS 5,508,546  4/1996  Zalameda et al. .................... 250/338.3

FOREIGN PATENT DOCUMENTS 2-67933  3/1990  Japan ................................. G01J 5/10

Primary Examiner—Constantine Hannaher
Assistant Examiner—Andrew Israel
Attorney, Agent, or Firm—Lynn & Lynn

[57] ABSTRACT

A pyroelectric infrared ray sensor includes a voltage amplifying circuit provided with a signal amplifying part having a non-inverting amplifier, with an integrating circuit, and with voltage dividing resistors connected at a position where an input $V_{IN}$ to the voltage amplifying circuit and an output $V_B$ of the integrating circuit are resistance-divided to a non-inverting input terminal of the signal amplifying part which is practically formed by an operating amplifier, wherein the signal amplifying part includes a low-pass filter formed by a resistor and a capacitor, whereby the electrostatic capacity of the required capacitor can be minimized, and the entire circuit can be minimized in size and also in manufacturing costs.

7 Claims, 9 Drawing Sheets

PYROELECTRIC INFRARED RAY SENSOR

BACKGROUND OF THE INVENTION

This invention relates to a pyroelectric infrared ray sensor which senses with a pyroelectric element any variation in energy amount of the infrared rays radiated from such object as human body so as to detect the presence and absence or movement of the object.

DESCRIPTION OF RELATED ART

In the infrared ray sensor of the kind referred to, the arrangement has been so made that a pyroelectric current provided as an output from the pyroelectric element as a result of variation in the energy amount of the infrared rays is converted by a current-voltage converting circuit into voltage signals, the voltage signal only of a predetermined frequency band (in detecting the movement of the human body, a frequency band about 1 Hz as the center) is amplified at a voltage amplifying circuit, and the voltage signal amplified at a voltage amplifying circuit is compared with predetermined threshold values for judgement to provide an output of a detection signal.

The known sensor of this kind comprises a current-voltage converting circuit for converting the pyroelectric current of the pyroelectric element, for example, into the voltage signals, the voltage amplifying circuit for amplifying the voltage signal only in the predetermined frequency band, and an output circuit for comparing the voltage signal amplified at the voltage amplifying circuit with the two, higher and lower threshold values for judgement. In this case, the current-voltage converting circuit converts the minute pyroelectric current (in the order of fA) provided from the pyroelectric element which has sensed the variation in the infrared ray energy due to the movement of the human body into a voltage by means of a composite impedance of a high resistance Rg, element capacity Cs of the pyroelectric element and an input impedance of a field effect transistor, provides this voltage to the gate of the field effect transistor as its input to have an impedance conversion performed and to cause a source voltage varied with a source follower action of the field effect transistor, and provides as an output in the form of the voltage signal a voltage drop occurring in an output resistor upon the source voltage variation.

Here, the voltage amplifying circuit is of a two step construction including a non-inverting amplifier employing an operational amplifier and an inverting amplifier also employing an operational amplifier, and has an amplification of about 80 dB. Further, a band-pass filter for allowing only the voltage signals in the frequency band (around 1 Hz) corresponding to the movement of the human body to pass therethrough is formed by properly selecting values of a feedback resistor and capacitor connected between inverting input terminal and output terminal of the two operational amplifiers and of operational-amplifier-use resistor and capacitor inserted between the two operational amplifiers. In such voltage amplifying circuit having the two-step amplifiers, further, the first step non-inverting amplifier as well as the second step inverting amplifier are so designed as to be substantially the same in the amplification, in order to simplify the circuit conditions. In this voltage amplifying circuit, further, a cut-off frequency of the band-pass filter on its lower band side is determined by a product of a resistance value of the operational-amplifier-use resistor and an electrostatic capacity of the capacitor connected in series between the output end of the operational amplifier and the inverting input end of the other operational amplifier, and these values give an influence also on the resistor which is determinative to the amplification.

The foregoing output circuit comprises a wind comparator which receives, at a comparator comprising operational amplifiers, the two, higher and lower threshold values produced through voltage dividing resistors as well as the voltage signals amplified by the voltage amplifying circuit and provides as an output a detection signal through an output resistor in the event when the voltage signal exceeds either one of the two threshold values (in the case when the voltage signal is over the higher threshold value or is below the lower threshold value).

When it is intended to minimize in size the circuit, the two capacitors one of which is connected to the resistor for use with the operational amplifier and the other of which is connected to the feedback resistor should preferably be smaller as possible in the electrostatic capacity, whereas resistors of too large resistance value cannot be employed as the operating-amplifier-use resistor and feedback resistor when the stability of the pyroelectric element or of the circuit is taken into account, and, for this reason, the foregoing known voltage amplifying circuit employs, for assuring a gain of 40 dB per each step, a combination of the resistance values of about 10 kΩ and about 1MΩ for the operational-amplifier-use resistor and feedback resistor. Provided that the operational-amplifier-use resistor is set to be of a value of about 10 kΩ, therefore, the capacitors are required to be of an electrostatic capacity of about several 10 μF in order to render the lower band cut-off frequency to be below 1 Hz under the particular conditions, so that any small chip capacitor cannot be employed as the capacitor connected to the operational-amplifier-use resistor and it has been difficult to minimize the entire circuit.

That is, the current circuitry technique does not allow any small chip capacitor to be employed when the electrostatic capacity of the capacitor reaches a level of several 10 μF, and it is required to employ a large chip capacitor or electrolytic capacitor. In the event where the latter electrolytic capacitor is employed, there arises a problem that such inherent characteristics of the electrolytic capacitor as a leakage current cannot be ignored, characteristics fluctuation is remarkable, the capacitor is not durable under temperature change and the capacitor is low in the long term reliability, and further that the circuit characteristics of the voltage amplifying circuit itself are influenced to fluctuate remarkably and to be deteriorated in the reliability, and any malfunction or failure of operation of the circuit is readily caused to occur.

Further when the current-voltage converting circuit is constituted by the field effect transistor employed as has been known, an improvement in S/N ratio is confronted with a specific limitation because a thermal noise occurring at a high resistance becomes remarkable, and it is extremely difficult to increase the sensitivity any more with the current circuit arrangement.

In another known arrangement, on the other hand, the pyroelectric element incorporated with the current-voltage converting circuit including the field effect transistor and such externally mounted electronic parts as the capacitor or resistor are mounted on a planar circuit substrate, and a multilens unit (condenser) is mounted above the pyroelectric element. This has been defective in that the configuration of the arrangement is rather enlarged and is readily influenced by any external noise. That is, this known arrangement is to amplify the minute pyroelectric current from the pyroelectric element through a long way trip via wirings on the circuit substrate, so that the circuit will be readily caused to malfunction by such noise as radio waves from amateur radio stations and portable telephones and further noise due to ON/OFF switch operation of motors, luminaires and so on. While there have been taken such measures as additional connection of noise-preventing capacitor or inductor coil for eliminating these problems, the sensor configuration is rather enlarged, and the circumstances have been far from the intended minimization in size, reduction of required number of parts, and decrease in manufacturing costs.

SUMMARY OF THE INVENTION

A primary object of the present invention is, therefore, to provide a pyroelectric infrared ray sensor which can overcome the foregoing problems and can minimize required electrostatic capacity of the capacitor to allow required circuit to be minimized in size and the costs to be decreased.

According to the present invention, the above object can be realized by means of a pyroelectric infrared ray sensor in which a pyroelectric current as an output of a pyroelectric element is converted into voltage signals, and the voltage signals in a predetermined frequency band are processed to be amplified at a voltage amplifying circuit to provide a detection signal as an output, wherein the voltage amplifying circuit comprises a signal amplifying part consisting of a non-inverting amplifier having an operational amplifier to an inverting input end of which a first resistor is connected and between the inverting input end and an output end of which a feedback resistor and a first capacitor are connected in parallel, an integration circuit consisting of a further operational amplifier to an inverting input end of which the output end of the signal amplifier is connected through a second resistor and between the inverting input end and an output end of which a second capacitor is connected, and voltage dividing resistors for resistor-division of an output of the integration circuit and an input to the voltage amplifying circuit and connected at a position of the resistor-division to a non-inverting input end of the signal amplifying part.

Other objects and advantages of the present invention shall be made clear in following description of the invention detailed with reference to preferred embodiments shown in accompanying drawings.

Figure 1:
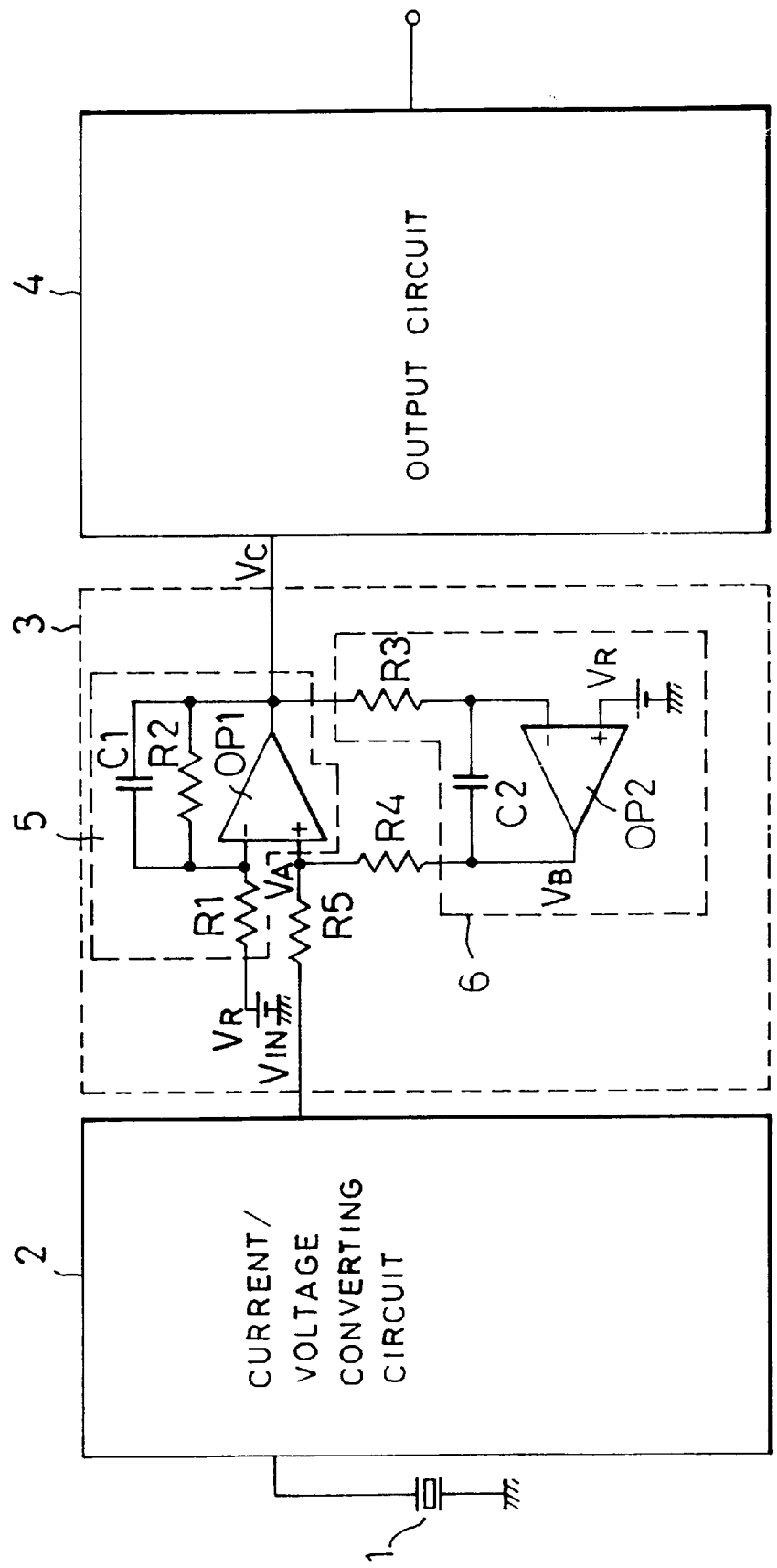
FIG. 1 is a block circuit diagram showing an embodiment of the pyroelectric infrared ray sensor according to the present invention.

While the present invention shall now be described with reference to the respective embodiments shown in the drawings, it should be appreciated that the intention is not to limit the invention only to these embodiments shown but rather to include all alterations, modifications and equivalent arrangements possible within the scope of appended claims.

DETAILED DESCRIPTION OF THE PREFERRED EMBODIMENTS

Embodiment 1:

A block circuit of Embodiment 1 of the present invention is shown in FIG. 1, in which a pyroelectric element 1 provides as an output a pyroelectric current in the order of fA to a current-voltage converting circuit 2 for converting the pyroelectric current into a voltage signal, and a voltage amplifying circuit 3 of a unique arrangement for amplifying the voltage signal in a predetermined frequency band only is connected to rear stage of the circuit 2.

The voltage amplifying circuit 3 of this embodiment is provided with a signal amplifying part 5 comprising a non-inverting amplifier including an operational amplifier OP1 an inverting input end of which is connected through a resistor R1 to a reference voltage source $V_R$ and a parallel connection of a feedback resistor R2 and capacitor C1 and connected between the inverting input end and an output end; with an integration circuit 6 comprising a further operational amplifier OP2 to an inverting input end of which the output end of the signal amplifying circuit 5 is connected through a resistor R3, between the inverting input end and an input end of which a capacitor C2 ia connected, and to a non-inverting input end of which the reference voltage source $V_R$ is connected; and with voltage dividing resistors R4 and R5 connected at a position where an output voltage $V_B$ of the integration circuit 6 and an input voltage $V_{IN}$ to the voltage amplifying circuit 3 are resistance-divided to a non-inverting input end of the signal amplifying circuit 5.

In the present embodiment, band-pass filter is formed with a low pass filter comprising the resistor R1 and capacitor C1 in the signal amplifying circuit 5, and a high pass filter formed by connecting the position of the resistance-division of the voltages $V_B$ and $V_{IN}$ by the voltage dividing resistors R4 and R5 to the non-inverting input end of the signal amplifying part 5 (in practice the operational amplifier OP1).

Here, cut-off frequencies fc1 and fc2 of the band-pass filter included in the voltage amplifying circuit 3 shall be obtained. Initially, the cut-off frequency fc1 on the higher band side is determined by a following formula (1) with the resistor R2 and capacitor C1:

$$fc1 = \frac{1}{2\,R2C1} \tag{1}$$

On the other hand, the cut-off frequency fc2 on the lower band side can be determined through following formulae (2), wherein the input to the voltage amplifying circuit 3 is denoted by $V_{IN}$, its output voltage is denoted by $V_O$, an input voltage to the signal amplifying part 5 is denoted by $V_A$, the output voltage of the integration circuit 6 is denoted by $V_B$, and the reference voltage is denoted by $V_R$:

$$V_O = V_A - \frac{R2}{R1} \cdot \frac{Zc1}{R2 + Zc1} \cdot (V_R - V_A) \quad (2)$$

$$V_B = \frac{V_O - V_R}{R3} \cdot Zc2$$

$$V_A = \frac{V_{IN} + (R5/R4) \cdot V_B}{1 + (R5/R4)}$$

From the above formulae, a gain $V_O/V_{IN}$ of the voltage amplifying circuit 3 is obtained as in a following formula (3):

$$\frac{V_O}{V_{IN}} = \frac{R4 + \frac{R2R4}{R1} \cdot \frac{Zc1}{R2+Zc1}}{R4 + R5 - \frac{R5}{R3}Zc2 - \frac{R2R5}{R1R3} \cdot \frac{Zc1Zc2}{R2+Zc1}} \quad (3)$$

Here, so that an absolute value of the gain is obtained as in a following formula (4):

$$\left|\frac{V_O}{V_{IN}}\right| = \left|\frac{R4 + \frac{R2R4}{R1} \cdot \frac{Zc1}{R2+Zc1}}{R4 + R5 - \frac{R5}{R3}Zc2 - \frac{R2R5}{R1R3} \cdot \frac{Zc1Zc2}{R2+Zc1}}\right| \quad (4)$$

Since the cut-off frequency fc2 is the frequency at which the above gain falls by 3 dB, the frequency can be obtained by means of the above formula, as in following formulae (5):

$$\frac{1}{\sqrt{2}} \cdot \frac{R2}{R1} = \frac{\omega R3R4(R1+R2)C2}{\sqrt{(R1+R2)R5^2 + \omega^2((R1R3C2)^2(R4+R5)^2)}} \quad (5)$$

$$\omega = \frac{R2R5(R1+R2)}{R1R3C2}\sqrt{\frac{1}{2R4^2(R1+R2)^2 - R2^2(R4+R5)^2}}$$

$$fc2 = \frac{R2R5(R1+R2)}{2\pi R1R3C2}\sqrt{\frac{1}{2R4^2(R1+R2)^2 - R2^2(R4+R5)^2}}$$

Here, in an event when a circuit is designed for amplifying only the signals around 1 Hz which being the optimum frequency band for detecting the movement of human body, selection of values is so made as the resistor R1=240Ω, resistor R2=2MΩ, resistor R3=2MΩ, resistor R4=3MΩ, resistor R5=330Ω, capacitor C1=0.047 μF and capacitor C2=0.1 μF, then the high and lower band cut-off frequencies will be fc1=1.69 Hz and fc2=0.73 Hz.

As the band-pass filter having the cut-off frequencies set around 1 Hz of the optimum frequency band for detecting the movement of human body, as in the above, the capacitors C1 and C2 employed can be of the electrostatic capacity in a range of about 0.01 μF to about 100 μF, and the required electrostatic capacity of the capacitors C1 and C2 can be minimized by the arrangement of the voltage emplifying circuit 3 of the present embodiment, while it has been required hitherto to employ an externally mounted capacitor of a large electrostatic capacity to a certain extent (several 10 μF). As a result, it is enabled to employ small chip-type electrolytic capacitor, chip-type ceramic capacitor or the like instead of the electrolytic capacitors, so as to be easy to minimize the circuit size, and there arises, in addition, an advantage that an infrared ray sensor excellent in the reliability can be provided, without being affected by the fluctuation of the electrolytic capacitors, leakage current and so on, as being freed from using the electrolytic capacitors.

Figure 2:
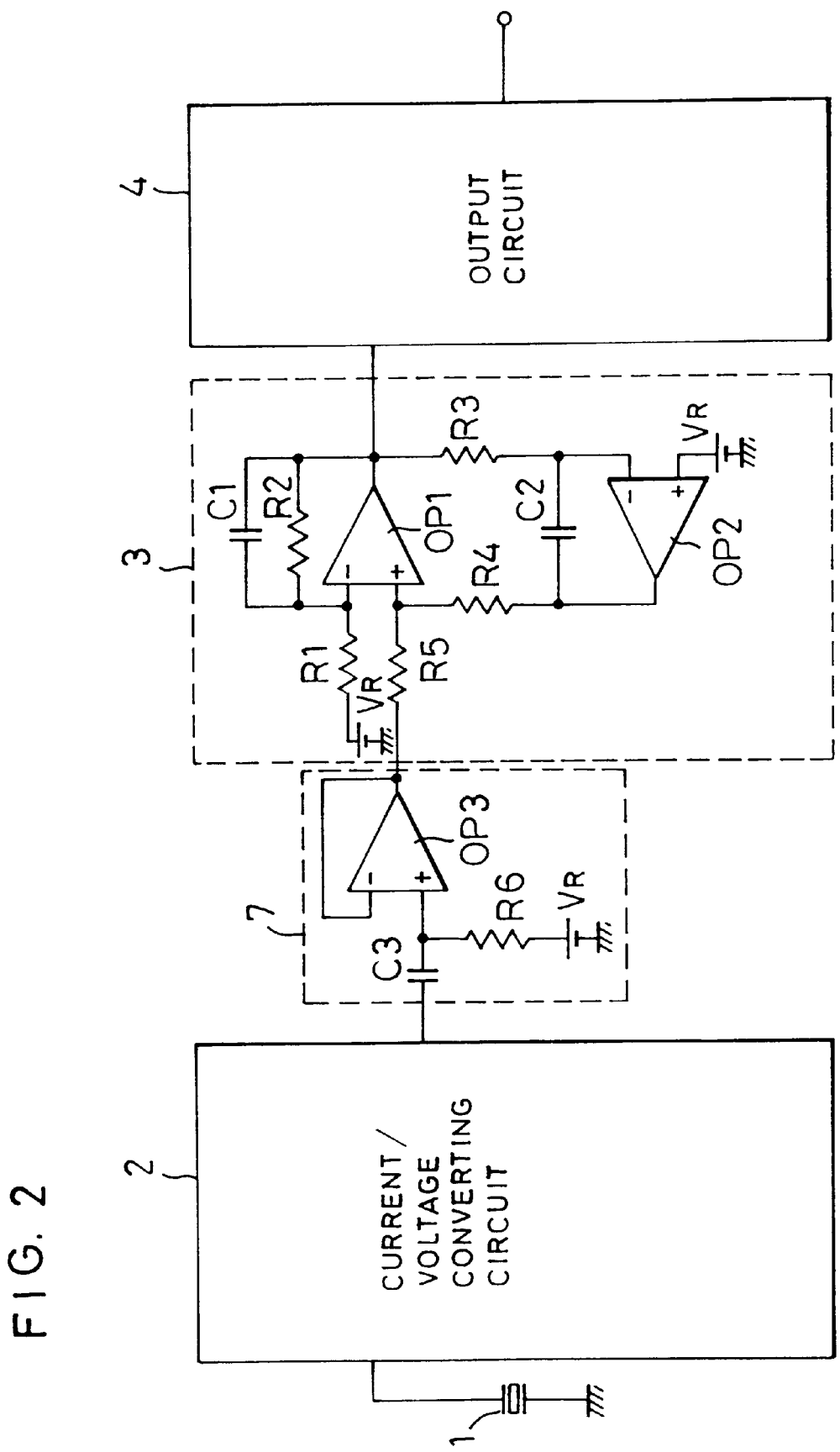
FIG. 2 is a block circuit diagram showing another aspect of the embodiment of FIG. 1.

On the other hand, the lower band side (low-pass filter) of the band-pass filter is a primary filter, and a removal of low frequency noise becomes insufficient when a high amplification is carried out. It is therefore desirable to provide such high pass filter 7 on the input side of the voltage amplifying circuit 3, as shown in FIG. 2. This high pass filter 7 is formed by connecting a differential circuit comprising a resistor R6 and a capacitor C3 to a non-inverting end of an operational amplifier OP3 acting as a buffer, and connecting an inverting input end of the operational amplifier OP3 to an output end of the amplifier, and its cut-off frequency fc3 is determined by the resistor R6 and capacitor C3, as in a following formula (6):

$$fc3 = \frac{1}{2\pi R6C3} \quad (6)$$

Here, as the values of the capacitor C3 and resistor R6 are so selected in practical circuit design as to C3=0.047 μF and R6=4.7MΩ, then the cut-off frequency will be fc3=0.72 Hz from the above formula (6), and the low frequency noise can be removed at a high efficiency with such high-pass filter 7.

Figure 3:
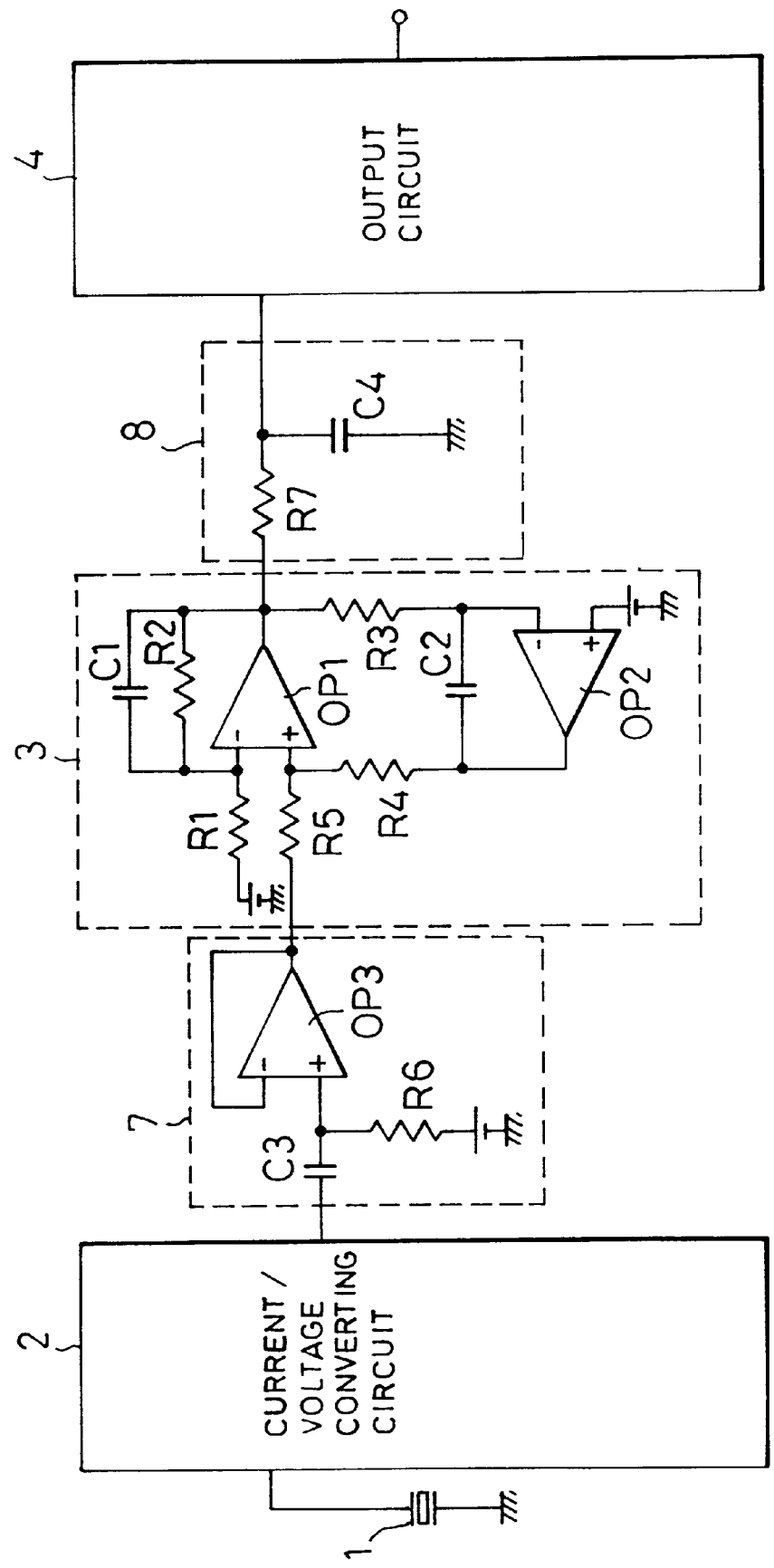
FIG. 3 is a block circuit diagram of another aspect of the embodiment of FIG. 1.

Since the higher band side (low-pass filter) is also a primary filter, the removal of high frequency noise will be also insufficient upon executing the high amplification. It is desirable, therefore, to provide a low-pass filter 8 on the output side of the voltage amplifying circuit 3, as shown in FIG. 3.

This low-pass filter 8 is constituted by an integrating circuit of a resistor R7 and a capacitor C4, and its cut-off frequency fc4 is determined by the resistor R7 and capacitor C4 as in a following formula (7):

$$fc4 = \frac{1}{2\pi R7C4} \quad (7)$$

Figure 4:
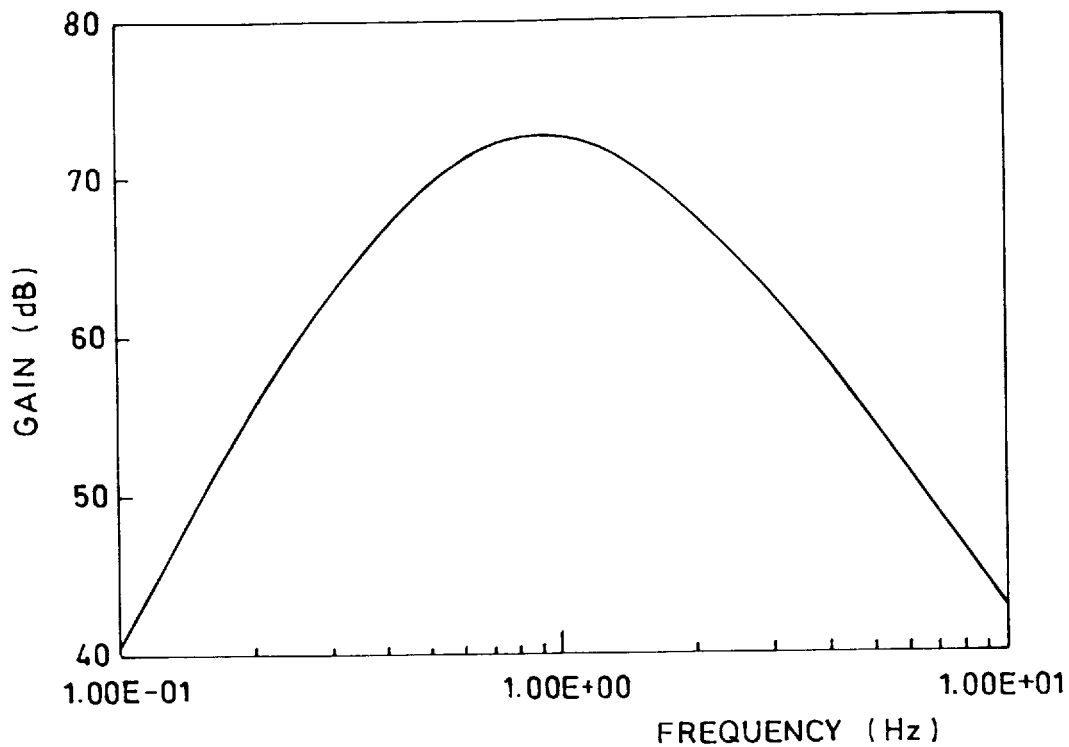
FIG. 4 is a diagram showing gain-frequency characteristics of the sensor of FIG. 1.

Here, as the values of the capacitor and resistor are so selected in practically designing the circuit as to be C4=0.1 μF and R7=1MΩ, then the cut-off frequency of the filter 8 will be fc4=1.59 Hz from the above formula (7), and the high frequency noise can be removed at a high efficiency by means of this low-pass filter 8. As shown also in FIG. 3, it is possible to constitute a band-pass filter having the secondary frequency characteristics on both sides of the lower and higher bands as a whole, by providing the high-pass filter 7 on the input side and the low-pass filter 8 on the output side respectively of the voltage amplifying circuit 3. In FIG. 4, the gain-frequency characteristics of the voltage amplifying circuit 3 thus constituted of the present embodiment are shown, and it has been found that the characteristics having the peak around 1 Hz can be obtained.

Figure 5:
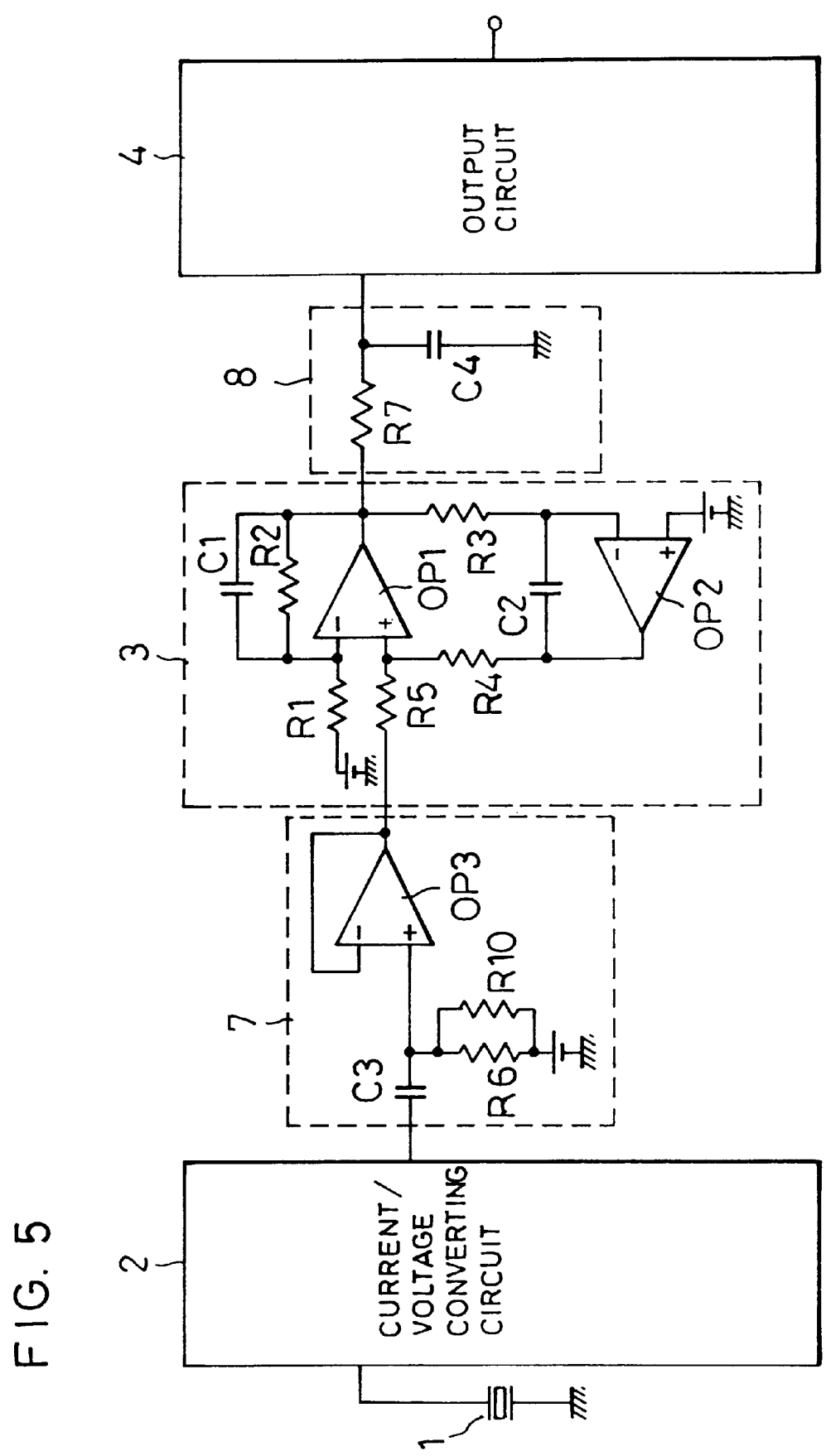
FIG. 5 is a block circuit diagram of another embodiment of the present invention.

Embodiment 2:

In FIG. 5, a block circuit diagram of a second embodiment of the present invention is shown. This embodiment is common to Embodiment 1 in the basic arrangement, and featuring parts only of this embodiment shall be described, with the same reference symbols given to common parts while omitting their description.

In such circuit arrangement of Embodiment 1 as shown in FIG. 3, there is a possibility that the sensor may malfunction unless the sensitivity of the entire sensor is lowered, since the noise occurring at the current-voltage converting circuit 2 at higher temperatures than normal temperatures to cause S/N ratio to be deteriorated. In the present embodiment, therefore, the arrangement is so made as to prevent such malfunction from occurring with the cut-off frequency fc3 of the high-pass filter 7 made to vary in response to the temperature to lower the sensitivity only at higher temperatures, by connecting a high resistor R10 large in the resistance-temperature characteristics in parallel to the resistor R6 forming the high-pass filter 7.

The cut-off frequency fc3 of the high-pass filter 7 in the present embodiment is represented by a folowing formula (8):

$$fc3 = \frac{1}{2\pi C3 R6 R10/(R6+R10)} \qquad (8)$$

Figure 6:
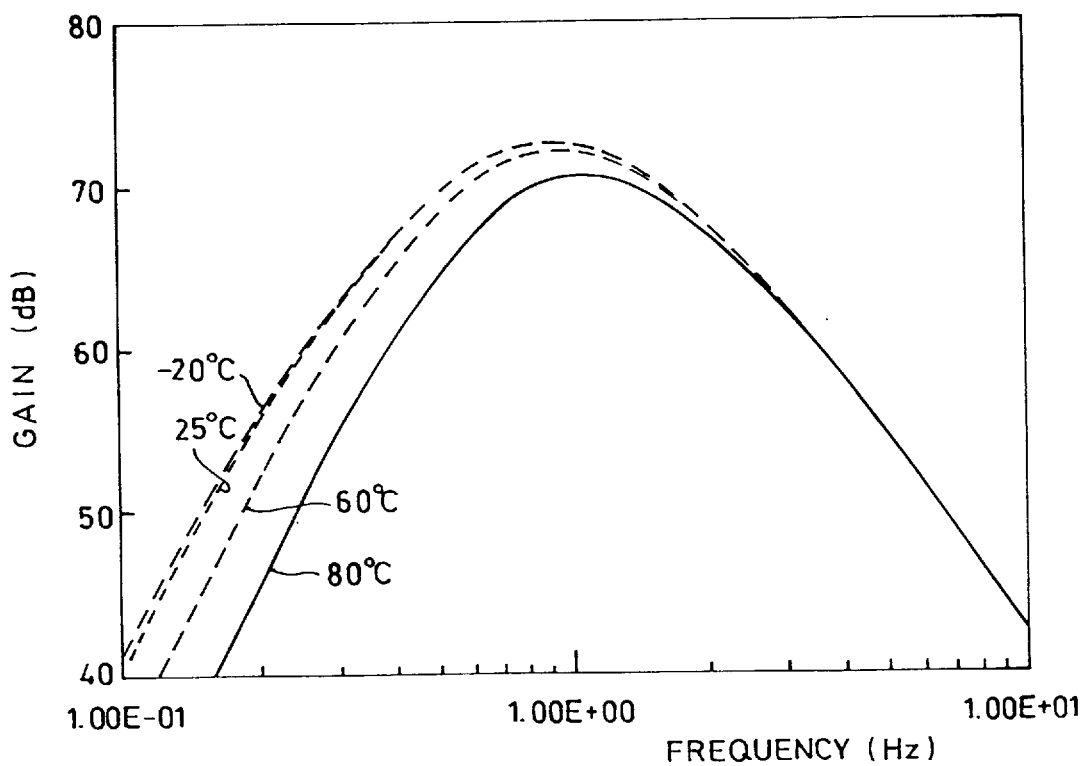
FIG. 6 is a diagram showing gain-frequency characteristics of the embodiment of FIG. 5.

Here, as the resistance value of the high resistor R10 is varied to be very small at higher temperatures, the cut-off frequency fc3 is made high, and such gain-frequency characteristics as shown in FIG. 6 can be obtained. The drawing shows the gain-frequency characteristic at temperatures (ambient temperatures) of −20° C., 25° C. (normal temperature), 60° C. and 80° C.

According to the present embodiment, the high resistor R10 large in the resistance-temperature characteristics is employed for elevating the cut-off frequency fc3 of the high-pass filter 7 at higher temperatures to have the sensitivity of the entire sensor lowered, so that the malfunction due to the increase in the noise of the current-voltage converting circuit 2 at the higher temperatures can be prevented.

Figure 7:
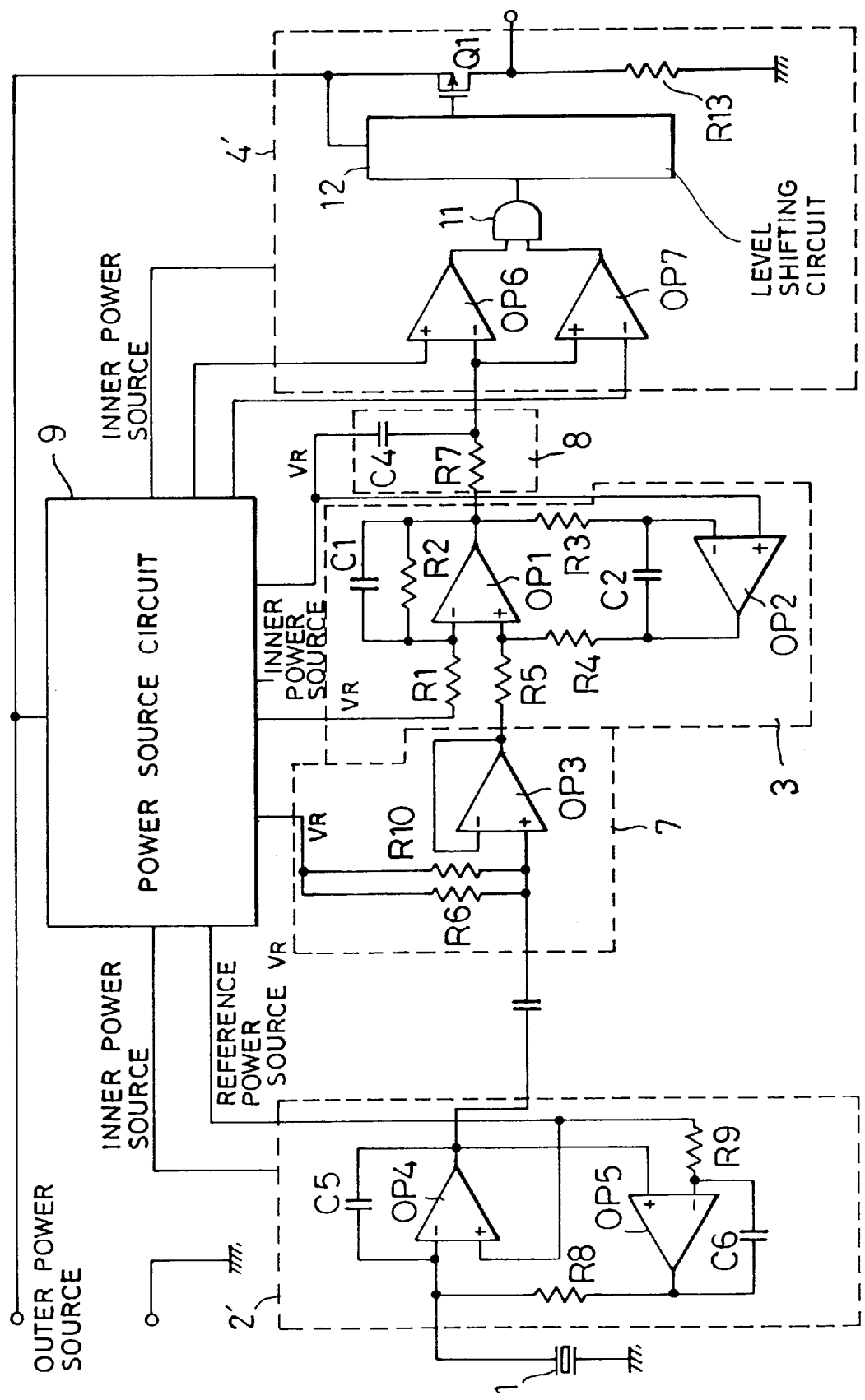
FIG. 7 is a block circuit diagram of another embodiment of the present invention.

Embodiment 3:

In FIG. 7, a circuit diagram of Embodiment 3 of the present invention is shown. In this instance, common parts to the foregoing Embodiments 1 and 2 are shown by the same reference symbols and their description shall be omitted. In the present embodiment, a power source circuit 9 is furnished with a power from an external power source and prepares an inner source power for actuating the respective circuits and the reference voltage $V_R$.

The current-voltage converting circuit 2' comprises an operational amplifier OP4 between an inverting input end and an output end of which a feedback capacity (capacitor C5) is connected and, to a non-inverting input end of which, the reference voltage $V_R$ is supplied from the power source circuit 9, and the pyroelectric current is input to an inverting input end of the operational amplifier OP4, so that the minute pyroelectric current is converted into a voltage signal of about several 10 μV by means of an impedance conversion of the capacitor C5. With this current-voltage converting circuit 2', any influence of the thermal noise known to be a ruling cause in the known current-voltage converting circuit 2 employing the field effect transistor FET as the buffer is reduced, so that S/N ratio can be remarkably improved to realize the low noise while improving the sensitivity.

Further, to the operational amplifier OP4 of the current-voltage converting circuit 2', an integrator comprising an operational amplifier OP5, a resistor R9 and a capacitor C6 is connected between the inverting input end and the output end of the amplifier OP4 as a DC feedback circuit, whereby the impedance characteristics of the capacitor C5 os which the operation becomes unstable with respect to a signal of low frequency can be improved. Further, the gain of the next stage voltage amplifying circuit 3 is obtained by the resistors R1 and R2 and capcitor C1 connected to the operational amplifier OP1 through a following formula (9):

$$\frac{R2}{R1} \cdot \frac{1}{2\pi fc1 R2 + 1} \qquad (9)$$

Here, when the circuit design is so made as to amplify only the signals around 1 Hz as being the optimum frequency band for detecting the movement of human body, it is possible to form a band-pass filter having the cut-off frequencies fc1 and fc2 set around 1 Hz which is the suitable frequency band for detecting the movement of human body, by selecting the respective values of the capacitor C1=0.047 μF, capacitor C2=0.1 μF, resistor R1=240Ω, resistor R2=2MΩ, resistor R3=2MΩ, resistor R4=3MΩ, and resistor R5=330Ω, so that the gain of the voltage amplifying circuit 3 will be about 3200 from the above formula (9).

On the other hand, the output circuit 4' is of an arrangement which provides the detection signal as its output by shaping the wave of the voltage signal (analogue signal) amplified to a predetermined level by the voltage amplifying circuit 3, at a wind comparator constituted with two operational amplifiers OP6 and OP7 employed. That is, the output voltage signal from the voltage amplifying circuit 3 is compared with the two, higher and lower threshold values at the wind comparator in the output circuit 4'. When the voltage signal exceeds either one of these two threshold values (in the event when the signal is above the higher threshold value or is below the lower threshold value), an output signal of the wind comparator is provided as an input to a level shifting circuit 12 through a NAND circuit 11, a PMOS transistor Q1 is driven by this level shifting circuit 12, so that the detection signal at a predetermined level is provided from an output resistor R13.

Figure 8:
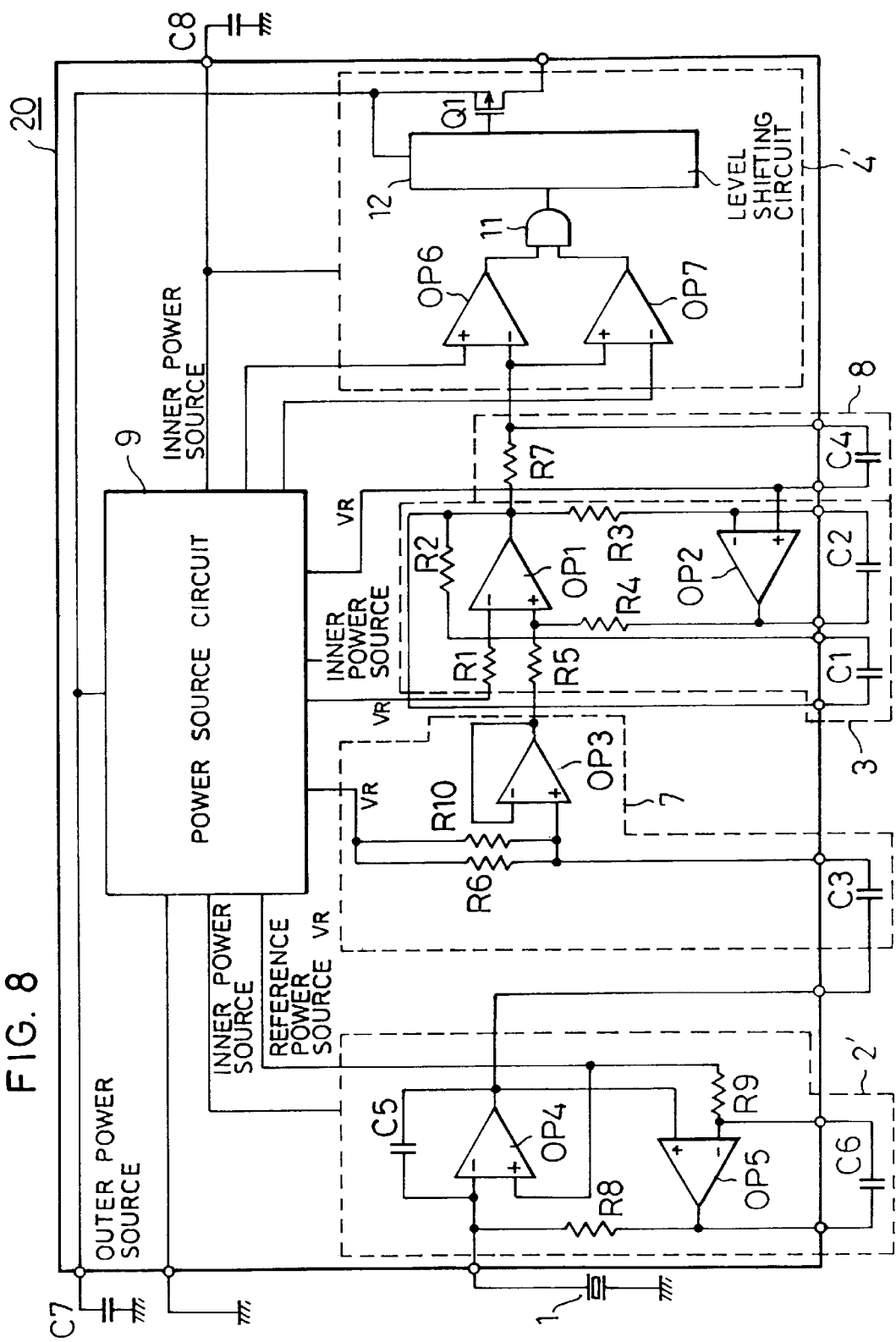
FIG. 8 is a concrete circuit diagram of the embodiment of FIG. 7.

The respective circuits of such arrangements as has been described are integrated into an integrated circuit 20 of one chip, with the parts enclosed by a thick line as shown in FIG. 8, while the pyroelectric element 1 and capacitors C1–C4 and C6–C8 which are relatively large in the electrostatic capacity are externally mounted to the integrated circuit 20. The high resistor R10 provided in the high-pass filter 7 for the temperature correction can be easily adapted to the integration by forming the resistor R10 with a non-doped polysilicon resistor or ON resistor of transistor. Further, the capacitors C7 and C8 will be externally mounted capacitors additionally provided to the external and inner power sources.

In the present embodiment as has been described in the above, almost all of the circuit constituents except such partial electronic parts as the pyroelectric element 1, capacitor C1 and so on can be formed into the IC and mounted in the one chip integrated circuit 20, so that the dimensional minimization and cost reduction can be further attained. For the current-voltage converting circuit 2', further, it is also possible to employ the same one as in the known arrangement utilizing the field effect transistor FET.

Figure 9:
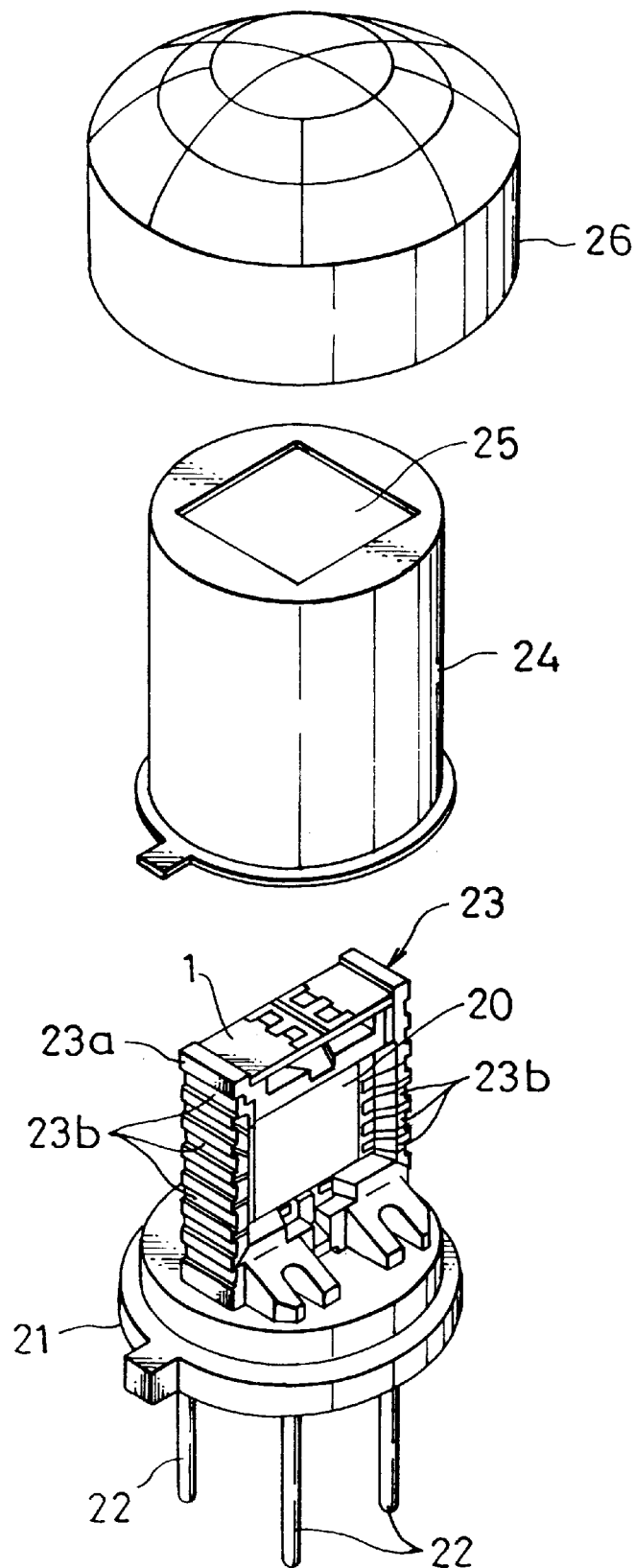
FIG. 9 is a perspective view as disassembled of the sensor in the embodiment of FIG. 7.

In FIG. 9, the pyroelectric infrared ray sensor according to the present embodiment is shown in a disassembled perspective view. The sensor of this embodiment is formed such that a three dimensional circuit block 23 is mounted onto a substantially disk shaped base 21 having three lead wires 22 projected downward in the drawing, a can 24 of a bottomed cylindrical shape but having in the top bottom an optical filter window 25 is fitted over the block 23 to the base 21, and a condenser (multilens unit) 26 substantially of a dome shape for condensing the infrared rays is mounted to the top of the can 24.

Figure 10A:
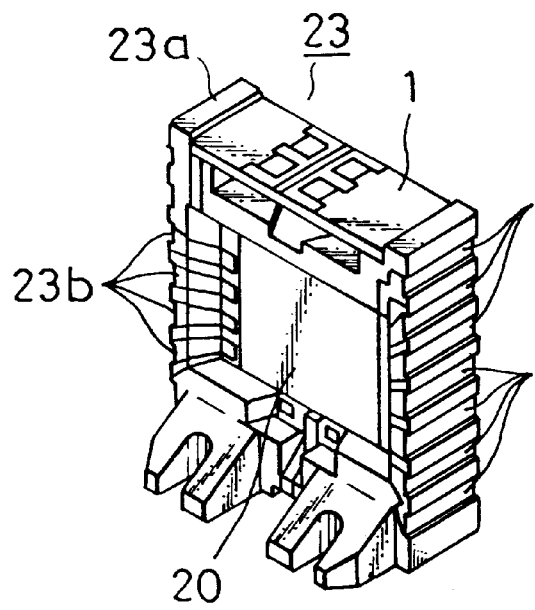
FIGS. 10a and 10b are perspective views in front side elevation and rear side elevation, respectively, of a three dimensional circuit block of the sensor in the embodiment of FIG. 7.
Figure 10B:
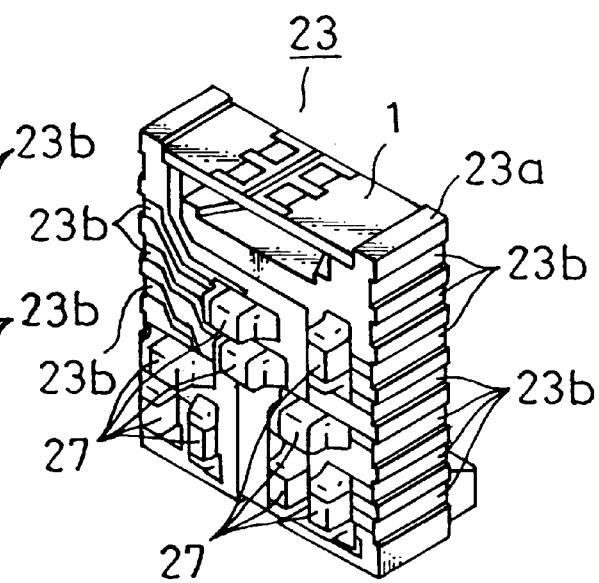

FIGS. 10a and 10b show the three dimensional circuit block 23, a main body 23a of which is constructed as an MID (Molded Interconnect Devices) substrate one-shot or two-color molded, the foregoing integrated circuit 20 is mounted onto part of conductor patterns 23b on front side elevation (FIG. 10a), the pyroelectric element 1 in a rectangular plate shape is mounted as bridging across both side top portions of the body 23a, and such externally mounted parts 27 as the capacitor C1 and so on to the circuit 20 are mounted to other parts of the patterns 23b on rear side elevation of the body 23a (FIG. 10b).

With such structure of the three dimensional circuit block 23, all other circuit elements than the externally mounted parts are mounted to the one-chip integrated circuit 20, so that the sensor can be remarkably minimized in size in contrast to the known sensors formed by mounting the pyroelectric element 1 and other electronic parts onto the planar circuit board. Further, a required wiring distance for leading the minute pyroelectric current output from the pyroelectric element 1 to the amplifier and so on is also remarkably shortened as compared with the known sensors.

In the known sensors, the planar circuit board for mounting the circuit elements, for example, is of a width 25–30 mm and a length 40–50 mm and the pyroelectric element is of a diameter 10 mm and a height about 10 mm with the top covering lens of a diameter 25 mm and a height 20 mm, whereas in the sensor of the present invention the circuit block 23 incorporating the pyroelectric element is about 7 mm both in the width and height and 2 mm in the thickness, the can 24 is 9 mm in diameter and 10 mm in height and the lens is 12 mm in diameter and 4 mm in height, substantially, so that the respective constituent elements can be made much smaller, so as to be remarkably contributive to the dimensional minimization of the sensor, as will be readily appreciated.

Further, as the three dimensional circuit block 23 to which the integrated circuit 20 is mounted is housed within the cylindrical can 24, the three dimensional circuit block 23 can be shielded by the can 24 from the external noise, whereby any capacitor or inductor as measures for removing the noise is made unnecessary, and an infrared ray sensor made more small, still excellent in noise-resistance characteristics and well reduced in the costs can be provided. It should be also appreciated that the invention brings about further advantage that the whole infrared ray sensor can be treated as an electronic part housed in the can 24 so as to render the required works for mounting the sensor to other apparatuses and equipments to be easier.

What is claimed is:

1. A pyroelectric infrared ray sensor in which an output pyroelectric current of a pyroelectric element is converted into a voltage signal, and the voltage signal only in a predetermined frequency band is amplified by a voltage amplifying circuit to be processed to provide a detection signal as an output; wherein the voltage amplifying circuit comprises a signal amplifying part consisting of a non-inverting amplifier including a first operational amplifier to an inverting input end of which a first resistor is connected and between the inverting input end and an output end of which a feedback resistor and a first capacitor are connected in parallel; an integrating circuit including a second operational amplifier to an inverting input end of which an output end of the signal amplifying part is connected through a second resistor, and between the inverting input end and an output end of which a second capacitor is connected; and voltage-dividing resistors connected at a position where an output of the integrating circuit and an input to the voltage amplifying circuit are resistance-divided to a non-inverting input end of the signal amplifying part.

2. The sensor according to claim 1 which further comprises a high-pass filter provided on input side of the voltage amplifying circuit.

3. The sensor according to claim 1 which further comprises a low-pass filter provided on output side of the voltage amplifying circuit.

4. The sensor according to claim 2 wherein the high-pass filter comprises a differential circuit of a resistor and a third capacitor, the high resistor being large in the resistance-temperature characteristics.

5. The sensor according to claim 4 wherein the resistor is at least one of a non-doped polysilicon and a transistor on-resistor.

6. The sensor according to claim 1 which further comprises a current-voltage converting circuit provided between the pyroelectric element and the voltage amplifying circuit for converting the pyroelectric current from the pyroelectric element into the voltage signal, the current-voltage converting circuit comprising an operating amplifier, a DC feedback circuit for feeding a DC component back to the operating amplifier, and an AC feedback circuit for feeding an AC component back to the operating amplifier.

7. The sensor according to claim 1 which further comprises a three dimensional circuit block to at least both surfaces of which electronic parts forming at least the voltage amplifying circuit and the pyroelectric element are mounted, and a cylindrical can having an optical filter covering the pyroelectric element for housing therein the three dimensional circuit block.

\* \* \* \* \*